(12) United States Patent
Wang et al.

(10) Patent No.: US 6,208,542 B1
(45) Date of Patent: Mar. 27, 2001

(54) TECHNIQUES FOR STORING DIGITAL DATA IN AN ANALOG OR MULTILEVEL MEMORY

(75) Inventors: Cheng-Yuan Michael Wang, San Jose; Andreas M. Haeberli, Campbell; Carl W. Werner, San Jose; Sau C. Wong, Hillsborough; Hock C. So, Redwood City; Leon Sea Jiunn Wong, Sunnyvale, all of CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 09/324,902

(22) Filed: Jun. 2, 1999

Related U.S. Application Data

(60) Provisional application No. 60/091,326, filed on Jun. 30, 1998, and provisional application No. 60/116,760, filed on Jan. 22, 1999.

(51) Int. Cl.$^7$ .................................................. G11C 27/00
(52) U.S. Cl. .................. 365/45; 365/189.03; 365/189.01
(58) Field of Search ........................ 365/184, 45, 185.03, 365/185.08, 189.09, 49, 189.03, 191, 189.01

(56) References Cited

U.S. PATENT DOCUMENTS

| | | | |
|---|---|---|---|
| 5,241,494 | * | 8/1993 | Blyth et al. ............................... 365/45 |
| 5,745,409 | * | 4/1998 | Wong et al. ...................... 365/185.03 |
| 5,801,980 | * | 9/1998 | Wong et al. ............................ 365/45 |
| 5,815,425 | * | 9/1998 | Wong et al. ............................ 365/45 |
| 5,828,592 | | 10/1998 | Tran et al. .............................. 365/45 |

OTHER PUBLICATIONS

Häberli, Andreas et al., "Compensatoin and Calibration of IC Microsensors," Thesis submitted to the Swiss Federal Institute of Technology Zurich, 1977, Diss. Eth. No. 12090, pp. 48–55.

User's Manual "ISD–T266SA CompactSPEECH™ Digital Speech Processor with Serial Flash Interface," ISD, San Jose, CA, Jul. 1997, 88 pages.
Data Sheet "IVS1530," Invox Technology, San Jose, CA, Oct. 1997, 8 pages.
Data Sheet "IVS1560," Invox Technology, San Jose, CA, Feb. 1998, 14 pages.
Data Sheet "ISD1520," ISD, San Jose, CA, Apr. 1998, 18 pages.
Data Sheet "ISD33060/075/090/120–4 Products," ISD, San Jose, CA, Apr. 1998, 31 pages.
Data Sheet "ISD4003 Series," ISD, San Jose, CA, Apr. 1998, 27 pages.
Data Sheet "ISD4004 Series," ISD, San Jose, CA, Sep. 1998, 28 pages.
Advanced Information "ISD5008," ISD, San Jose, CA, Nov. 1998, 2 pages.
Press Release "ISD Announces the Only Fully–Integrated Voice Storage Microchip Designed for Every Digital Cellular Handset," ISD, San Jose, CA, Nov. 16, 1998, 2 pages.

* cited by examiner

*Primary Examiner*—David Nelms
*Assistant Examiner*—Thong Le
(74) *Attorney, Agent, or Firm*—Skjerven Morrill MacPherson LLP

(57) ABSTRACT

An integrated circuit stores analog or digital information, or both, in memory cells (416). The memory cells provide analog or multilevel storage. Analog information is provided through an analog signal input (405), and digital information is provided through a digital signal input (407). A scheme for storing digital information is consistent with the scheme used to store analog information. Data is retrieved from the memory cells, and output to the analog or digital signal output (454, 463) depending on the type of data. A digital reference generator reference generator (425) generates various analog equivalent voltages for the digital signal input.

35 Claims, 9 Drawing Sheets

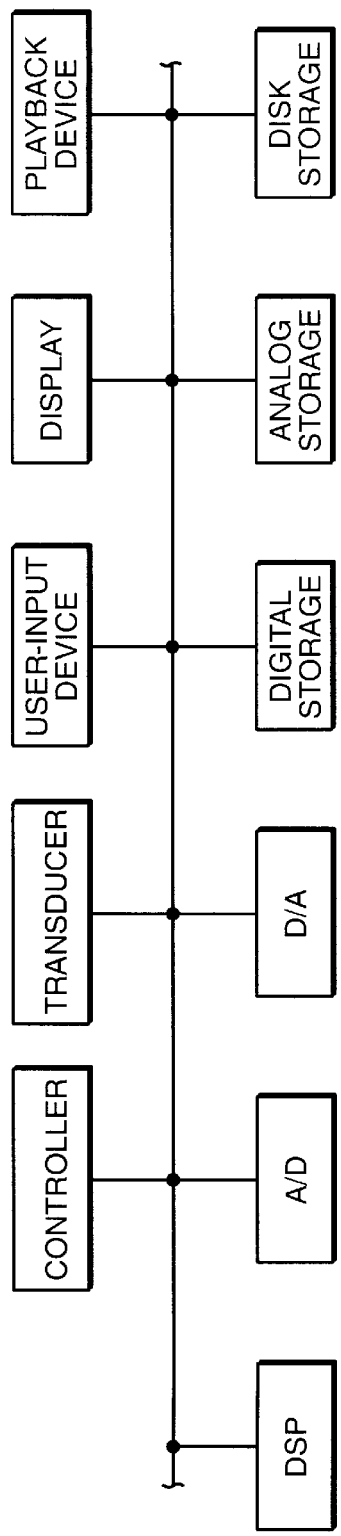
FIG._1
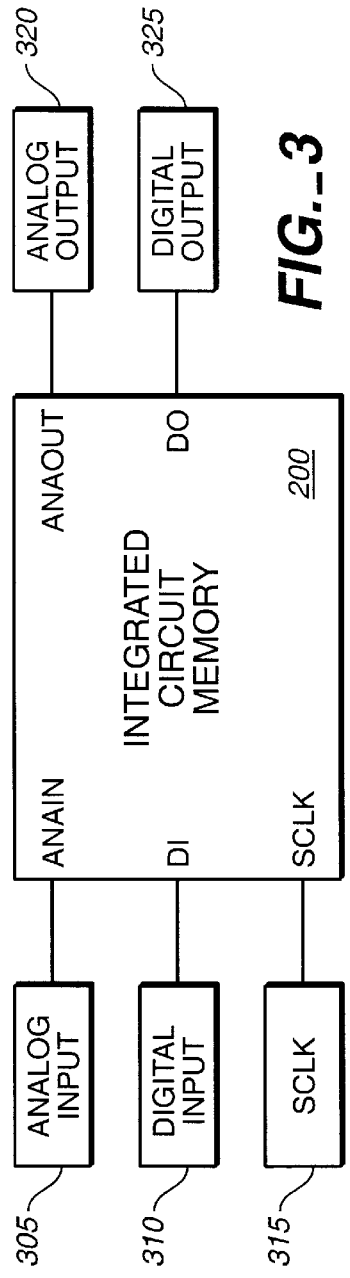
FIG._3

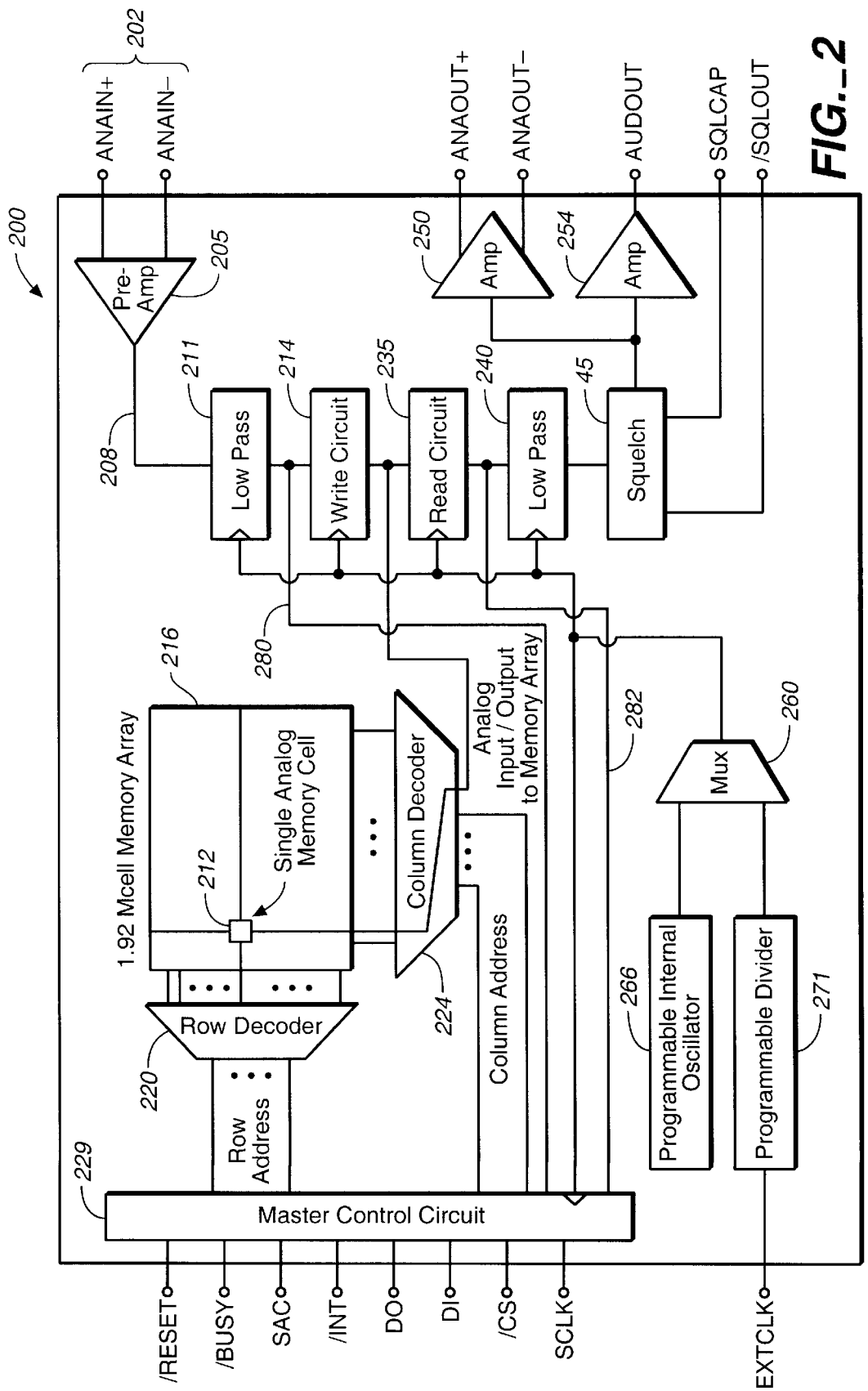
FIG._2

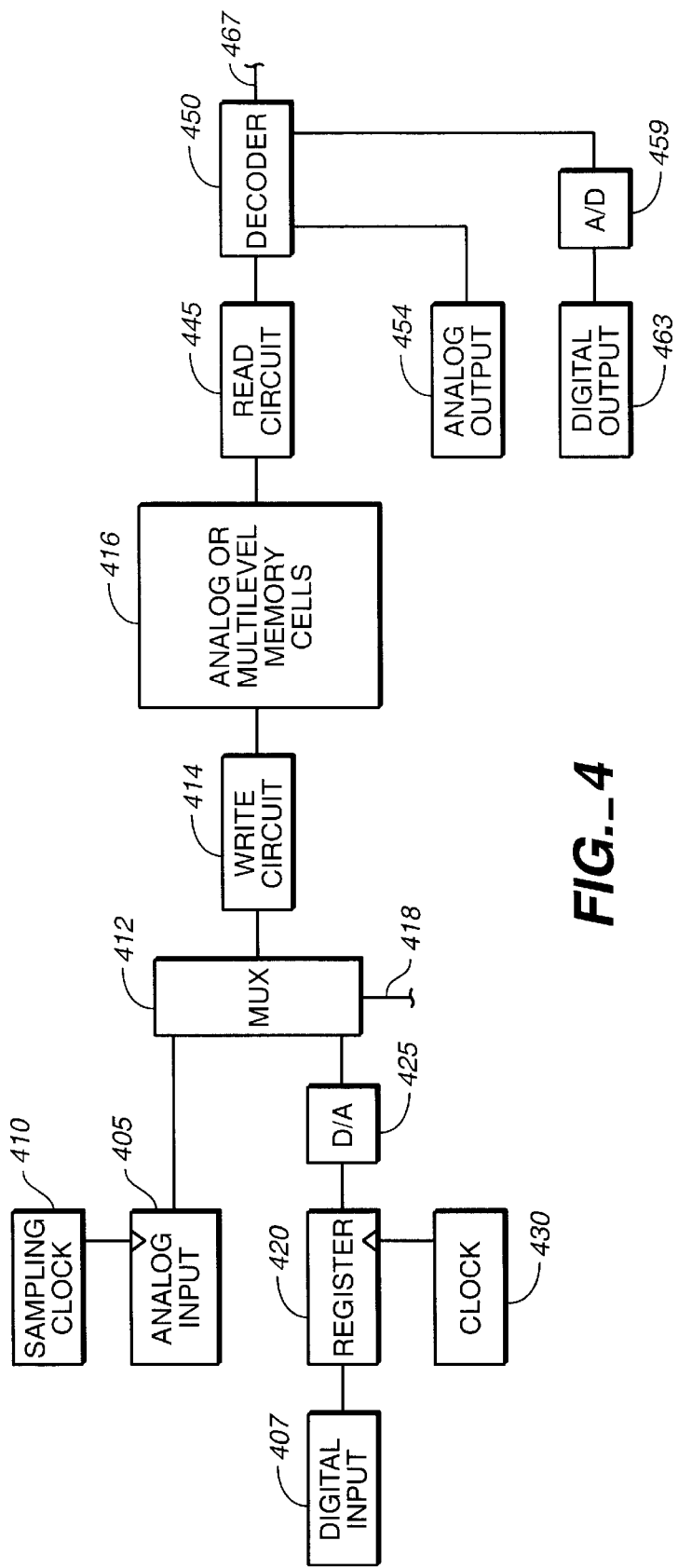
FIG._4

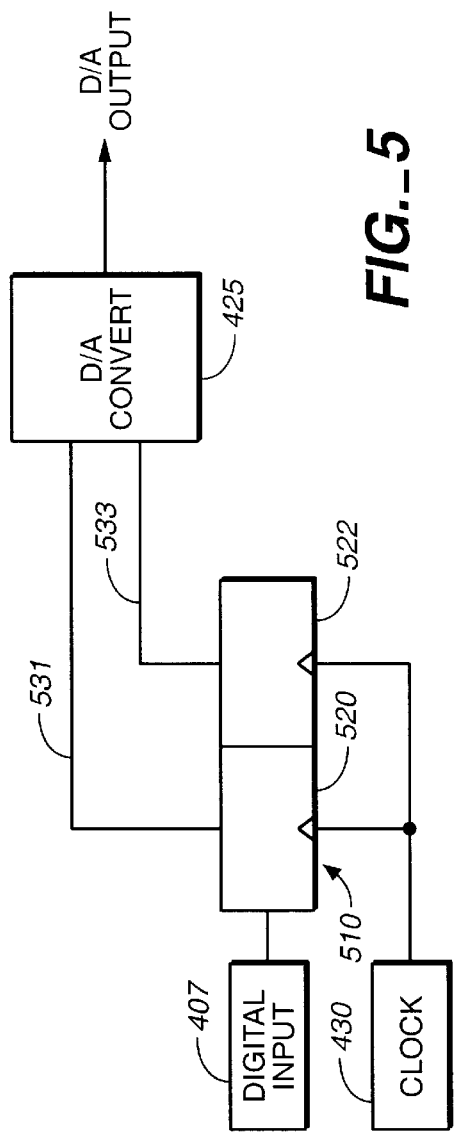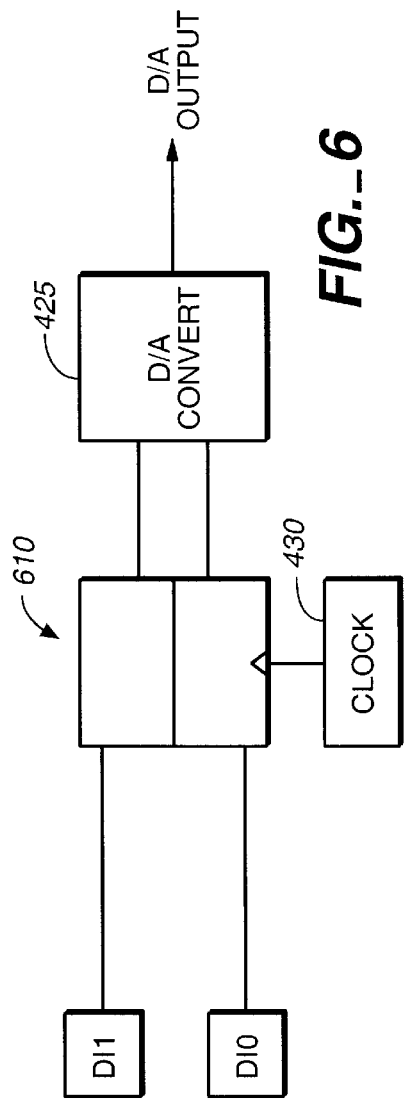

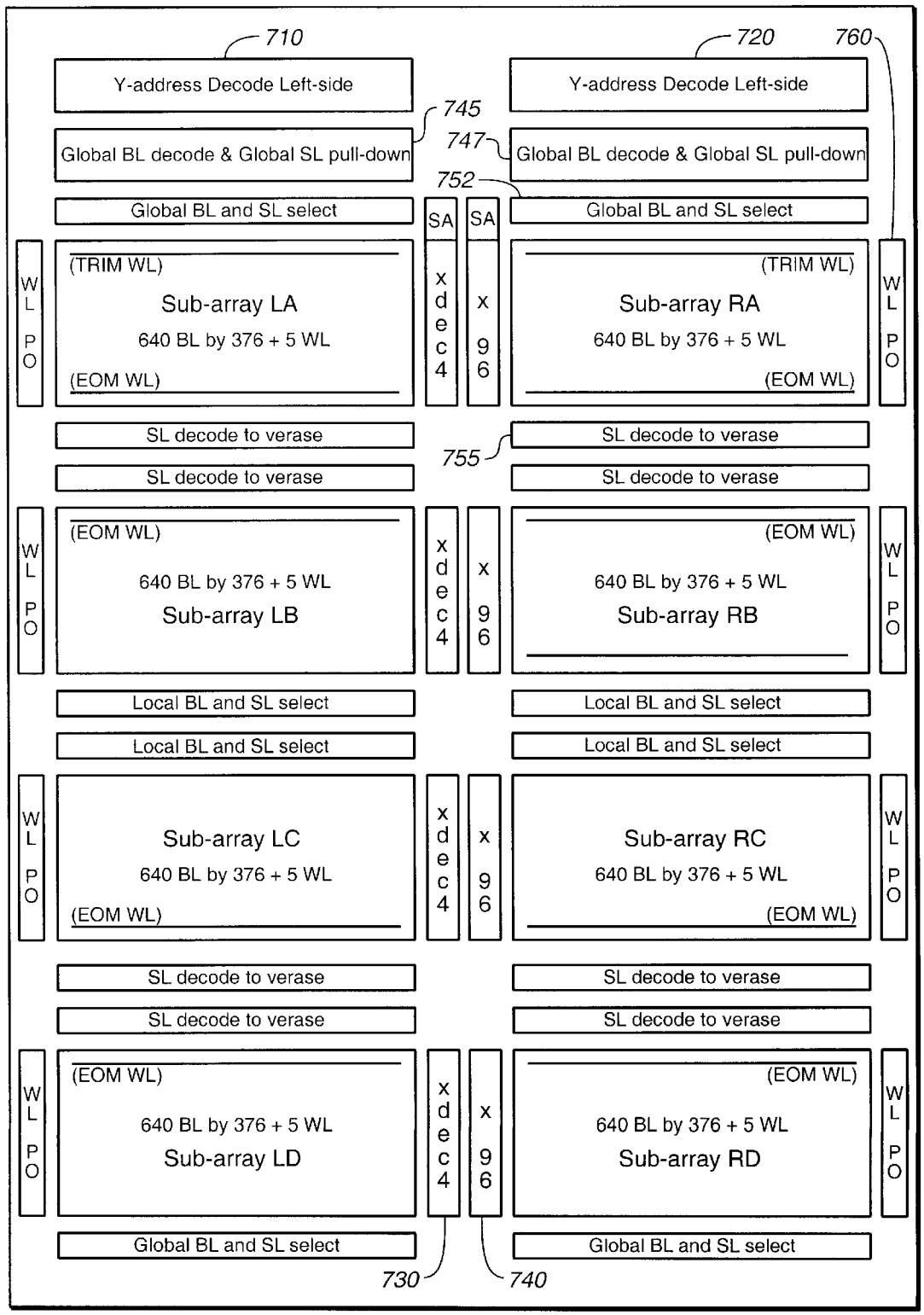
FIG._7

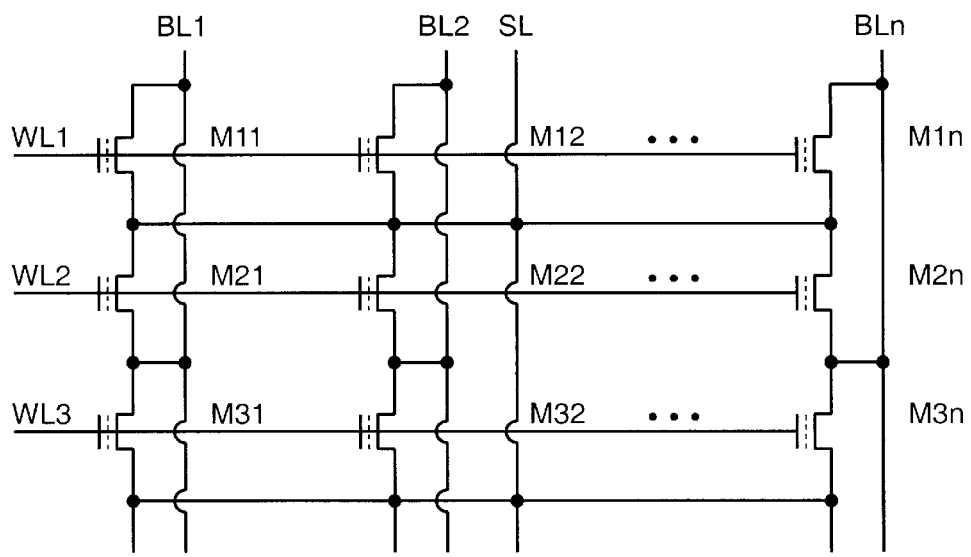
FIG._8
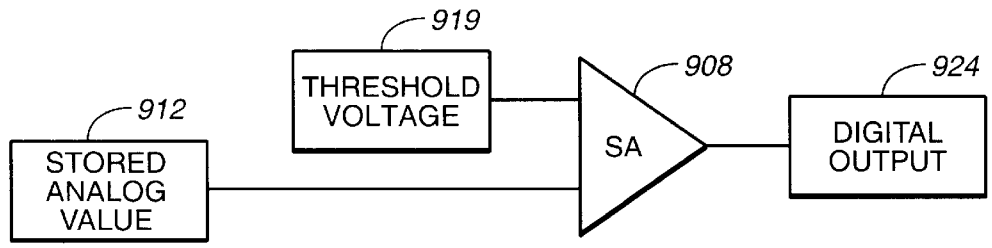
FIG._9
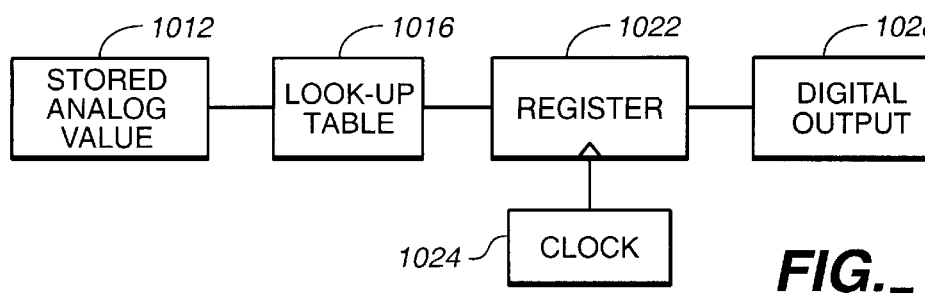
FIG._10

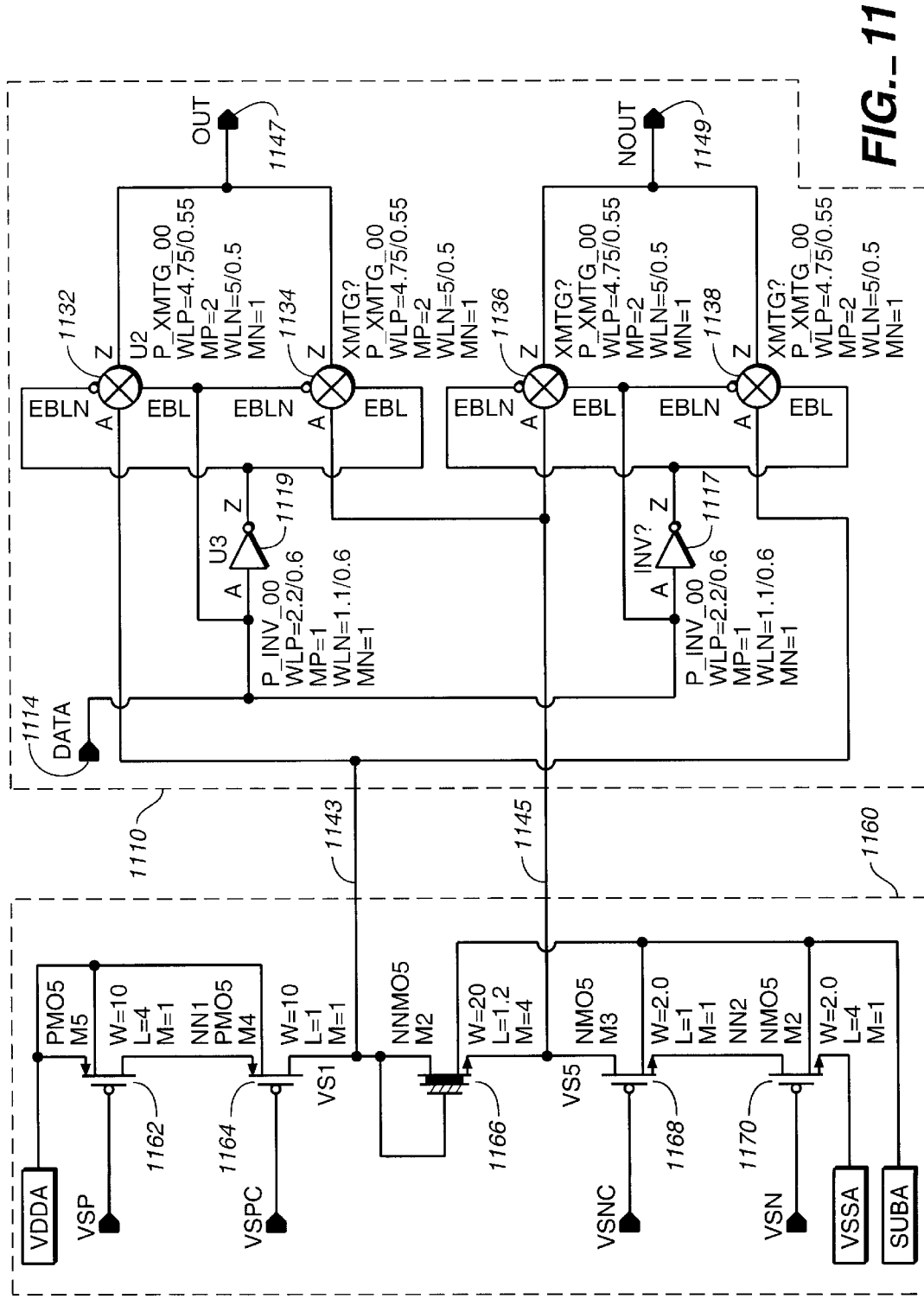
FIG._11

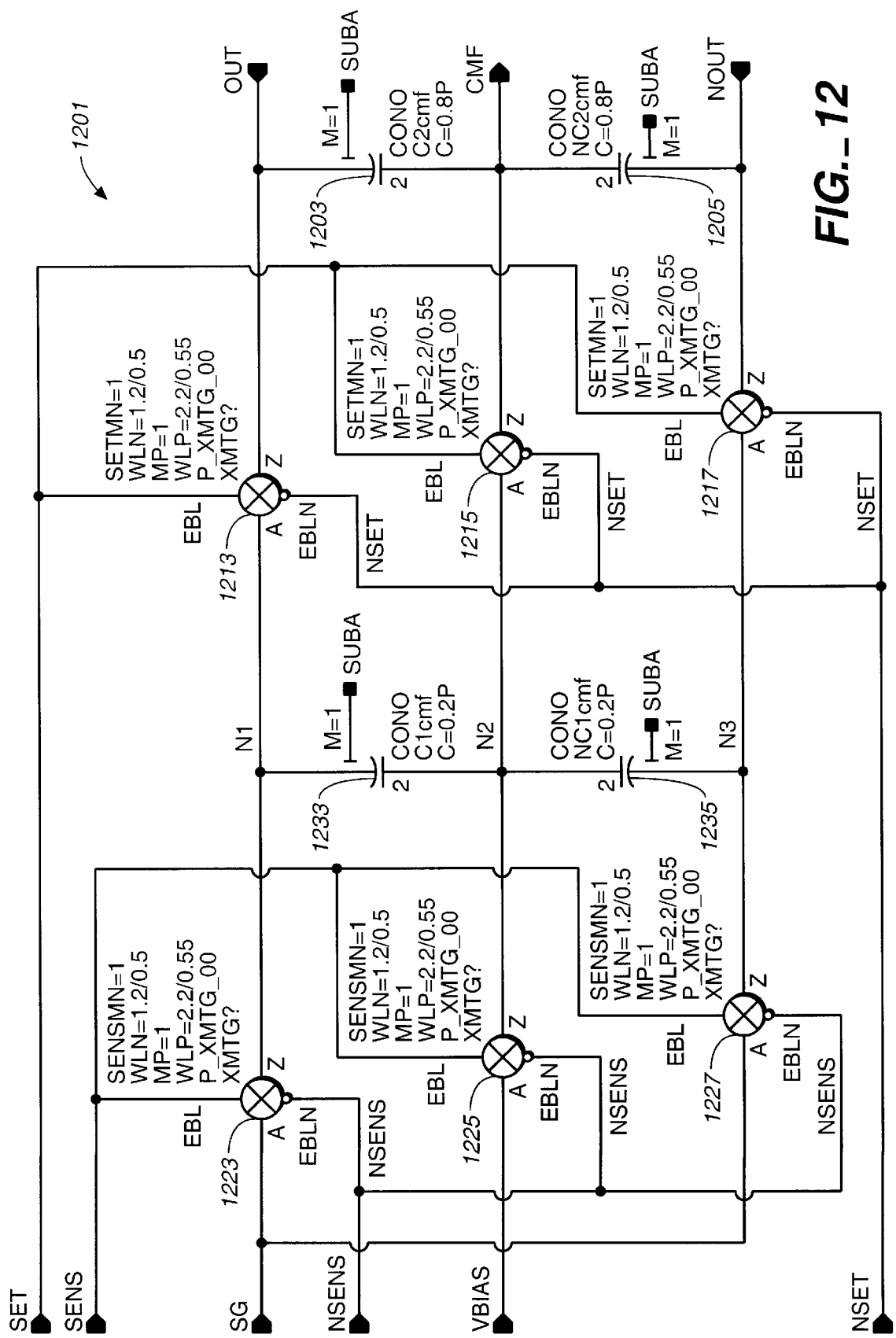
FIG._12

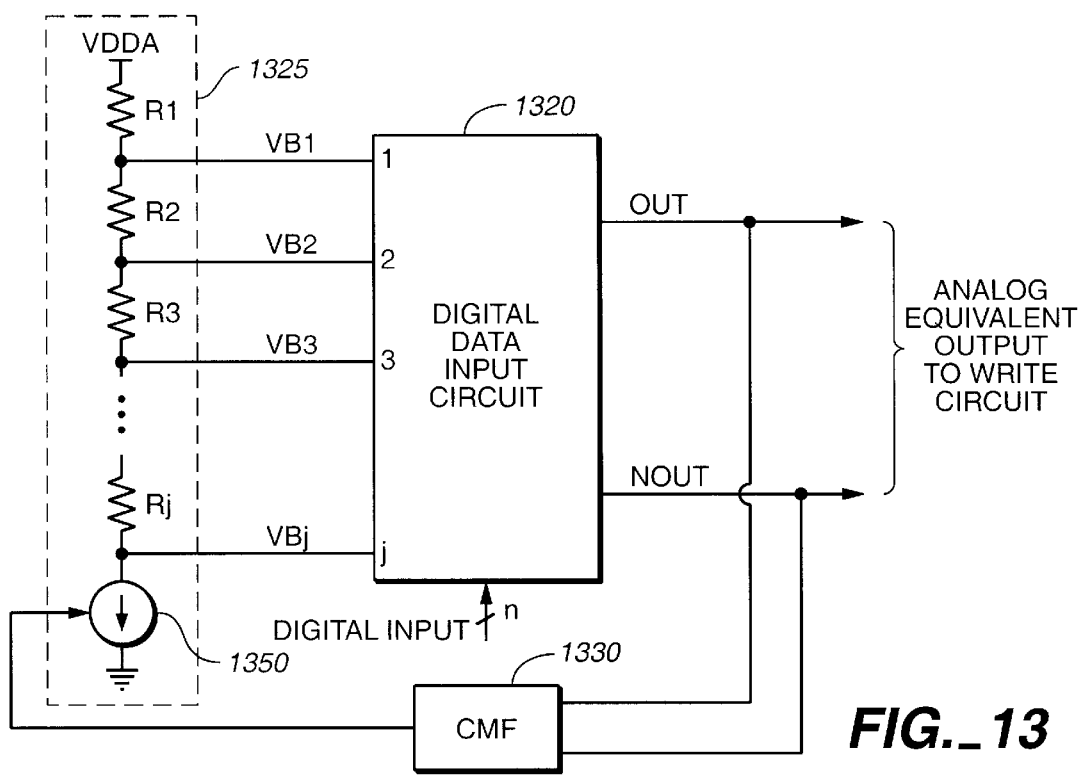
FIG._13
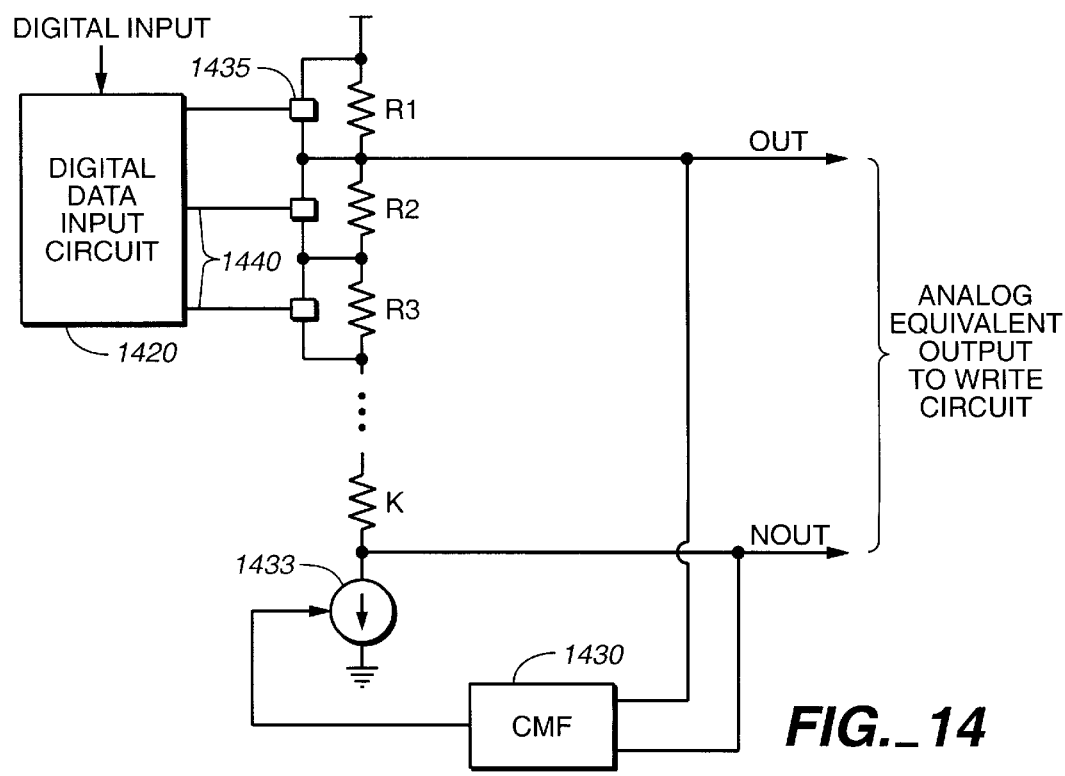
FIG._14

TECHNIQUES FOR STORING DIGITAL DATA IN AN ANALOG OR MULTILEVEL MEMORY

This application claims the benefit of U.S. provisional patent application No. 60/091,326, filed Jun. 30, 1998, and U.S. provisional patent application No. 60/116,760, filed Jan. 22, 1999, which are incorporated by reference.

BACKGROUND OF THE INVENTION

The present invention relates to the field of information storage and retrieval using integrated circuit technology. More specifically, the present invention relates to techniques for storing and retrieving analog or digital data, or both, within an integrated circuit using multilevel nonvolatile cells.

In the real world, information comes in both digital and analog forms. Some examples of analog information include voices, sounds, images, video and electromagnetic radiation. Digital data includes binary information used in computers and electronic systems. There are digital integrated circuit memories such as DRAMs, SRAMs, Flash, and EEPROM memories. There are also analog integrated circuit memories. Some examples of analog integrated circuit memories are described in U.S. Pat. Nos. 5,694,356, 5,680,341, 5,745,409, 5,748,534, 5,748,533, 5,818,757, and U.S. provisional patent application Nos. 60/091,326 and 60/116,760, all incorporated by reference.

Although these types of memory devices have met with substantial success, there is a need for devices that will store both analog and digital information. As an example, in telephony applications, it is desirable to have an answering machine memory chip that can store both voice messages and digital information such as phone numbers. These memory devices should store the analog or digital data directly, without requiring the additional processing time and complexity of, for example, translating analog information into a digital form. Techniques are also needed for an analog and digital memory that will facilitate further miniaturization in electronics for use in such devices as voice recorders, cellular phones, animal- or human-implantable devices, and others.

Therefore, techniques and devices are needed for storing and retrieving analog and digital data using integrated circuit technology.

SUMMARY OF THE INVENTION

The present invention provides techniques to implement an integrated circuit memory for storing digital and analog data. Analog information is provided at an analog input and sampled. Each analog sample is stored in one or more memory cells in analog form. The memory cells of the present invention provide analog or multilevel storage of data. These memory cells may be floating gate memory cells, which are nonvolatile. The sampling frequency can be fixed or user-selectable. Digital data is provided at an digital input and stored into the memory cells of the integrated circuit. The same memory cell used for analog information storage on one occasion may be used for digital information storage on another occasion. Analog data may be retrieved from the memory cells and output at an analog output. Digital information may be received from the memory cells and output at a digital output.

In one embodiment, the invention is a method of storing information in a memory. An analog signal is provided at an analog signal input. A digital data is provided at a digital signal input. The analog signal input is sampled at a sampling frequency. This sampling frequency can be fixed by the design on the integrated circuit or user-selectable. The user can select the sampling frequency by changing an external device to the integrated circuit, such as a resistor or capacitor, or by loading into the device an indication (e.g., a series of bits) of the desired frequency. Samples of the analog signal are stored in an array of memory cells, where a memory cell holds one sample of the analog signal. The digital data is stored in the array of memory cells, wherein a memory cell holds at least one bit of the digital data. Each memory cell may store two, three, four, five, six, seven, eight, or more digital bits of data. The invention provides a consistent scheme for storing both analog and digital data.

In another embodiment, the invention is an integrated circuit including an array of memory cells and a write circuit to store information provided at an analog input and a digital input of the integrated circuit into the memory cells. The information provided at the analog input is in an analog form and at the digital input is in digital form. A multiplexer selectively couples the analog or the digital input to a common write circuit, to convert the input to a precise threshold voltage and store into one memory cell.

A further embodiment of the present invention is an integrated circuit including a plurality of memory cells and a write circuit connected to the memory cells. A read circuit will determine a threshold voltage stored in individual memory cells, and will provide an analog equivalent of the stored threshold voltage at an analog output or will provide a digital equivalent of the stored threshold voltage at a digital output. Individual memory cells are configured using the common write circuit to store a precise threshold voltage level based on the sampled input level. In a specific implementation, the read circuit determines whether a threshold voltage stored in a memory cell is above or below a reference level, and provides to the digital output a first logic level when the stored threshold voltage is below the reference level and a second logic level when the stored threshold voltage is above the reference level.

In a further embodiment, the present invention is an integrated circuit including an array of multilevel memory cells and a write circuit connected to store data in the array of multilevel memory cells. A digital reference generator receives digital data and converts the digital data into an analog equivalent form. The analog equivalent form is provided to the write circuit. In a specific implementation, the digital reference generator includes a bias voltage generator generating a number of bias voltages. The digital reference generator also includes a digital data input circuit to generate the analog equivalent form of the digital data by selecting combinations of the bias voltages.

The invention also includes a method of storing information in a memory including providing an analog signal at an analog signal input and providing digital data at a digital signal input. The analog signal input is sampled at a sampling frequency, where may be user-selectable. Samples of the analog signal are stored in an array of memory cells, where a memory cell holds at least one sample of the analog signal. The digital data is stored in the array of memory cells, where a memory cell holds at least a bit of the digital data. The digital data is stored by first erasing a sector of memory cells and then writing the digital data in the sector of memory cells. A digital value is written in each memory cell of the sector not written with the digital data. This ensures memory cells do not subject to an overerase condition. A sector, sometimes called page, of memory cells may be any number of memory cell (e.g., 3K cells). The memory cells in a sector will usually have a common source line, or erase node, in order to erase the contents of the whole sector of cells together.

In another aspect, the present invention includes the use of an integrated circuit to store both analog signals and digital data in the same analog or multilevel memory cells of the integrated circuit, where the sampling frequency used to sample the analog signals can be user-selectable. The invention includes the use of requiring writing of every memory cell in a sector of an integrated circuit with a value in order to prevent overerase of the memory cells in the sector. The invention also includes the use of a digital reference generator to generate a analog equivalent to a digital quantity to be stored, and storing this analog equivalent into memory cells of an integrated circuit. In a further aspect of the invention, the use of an analog memory integrated circuit as a nonvolatile multilevel digital memory Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 1 shows an electronic system;

FIG. 2 shows a block diagram of an integrated circuit of the present invention;

FIG. 3 shows a diagram of inputs and outputs to the integrated circuit;

FIG. 4 shows a diagram of the analog and digital storage and retrieval circuitry;

FIG. 5 shows an implementation of a digital storage input path;

FIG. 6 shows another implementation of the digital storage input path;

FIG. 7 shows a diagram of an organization of a memory array;

FIG. 8 shows a plurality of memory cells sharing a common source line;

FIG. 9 shows an implementation of a digital storage output path;

FIG. 10 shows another implementation of a digital storage output path;

FIG. 11 shows a digital reference generator circuit; and

FIG. 12 shows a common mode feedback circuit for digital reference generator;

FIG. 13 shows an implementation of a digital reference generator circuit for n digital data bits; and FIG. 14 shows another implementation of a digital reference generator circuit.

DETAILED DESCRIPTION

FIG. 1 shows an electronic system in which techniques and devices according to the present invention may be used. In an embodiment, the present invention is an integrated circuit memory for storing analog and digital data. An integrated circuit according to the present invention may be used in many market segments including, to name a few, the communications market, medical market, consumer market, and industrial market. Some applications of such devices include cellular phones, handheld portable devices or appliances, telephone answer machines, mobile radios, telephone announcement systems, pagers and voice pagers, medical monitoring equipment, cash registers, bar code readers, vending machines, security systems, instrumentation, automobiles, interactive media, cameras, calculators, pocket recorders, recordable postcards and greeting cards, toys and games, watches and clocks, consumer recording media, video players and recorders, imaging, personal digital assistants (PDAs), palm-sized PCs, desktop and notebook computers, portable electronic commerce devices, electronic information storage media, and many other applications.

FIG. 1 shows an electronic system including a controller, transducer, user-input device, display, playback device, DSP, A/D converter, D/A converter, digital storage, analog storage, and disk storage. An electronic system may include any combination or all these components, as well as others that are not specifically named. The components are electronically interconnected by, for example, a bus, wires, phone lines, a network, local or wide area network, or the Internet.

FIG. 2 shows a diagram of an overall block diagram of an integrated circuit 200 of the present invention for information storage. The analog data inputs are ANAIN+ and ANAIN−. The digital data input is from DI. The analog data outputs appear at ANAOUT+, ANAOUT−, and AUDOUT. The digital output is at DO. The other pins (e.g., SQLCAP, /SQLOUT, /RESET, /BUSY, SAC, /INT, /CS, SCLK, EXTCLK) in FIG. 2 are for function control and interfacing with other devices in the system.

An analog signal 202 to be stored is differentially input at ANAIN+ and ANAIN− inputs. Other embodiments may have a single-ended input instead of a differential input. A differential input may provide greater accuracy when recording a voice signal. The input signal is amplified using a preamplifier 205. For example, the preamplifier may have a gain of about 25 decibels.

An output 208 of preamplifier 205 is also fully differential, although a single-ended output may be provided instead (or in addition to the differential output). Output 208 is passed to a low pass filter 211. Low pass filter 211 can be implemented using a sampled data filter, where the output of filter 211 will be the samples of the input signal. In other embodiments, low pass filter 211 is a continuous time filter.

The integrated circuit also has a digital input path 280 and a digital output path 282. Digital data is provided from the DI input using master control circuit 229. The digital data is stored using the same write circuit 214 used to store analog data from output 208. Digital data is output from a read circuit 235 to the DO output using the master control circuit. Common write circuit 214 and common read circuit 235 are used for writing a reading of both analog and digital data.

In a typical digital integrated circuit memory, such as DRAM, SRAM, EEPROM, EPROM, and Flash EEPROM, each memory cell only stores, or can represent, two possible logic levels. In a binary system, the two levels would represent a logic low or a logic high. To store an analog data point in such memory arrays, the sampled data point needs to be converted into a binary representation. For example, if the sampled data point were converted to a value having 256 different discrete levels, then 8 binary memory cells (i.e., $2^8$) are required.

In the present invention, however, using common write circuit 214, each sampled analog or multilevel digital data point is stored in a single memory cell 212. This permits much greater density of storage compared to binary memory cells. The memory cell may be referred as an "analog" memory cell since the memory cell can store a relatively large range of analog values. The memory cell also can be called a "multilevel" memory cell. These analog threshold voltage (VT) values have discrete steps such as, for example, 10 millivolt steps. In other embodiments, the analog values are continuous. Although a memory cell can store an analog value or digital value, a degree of precision for such a memory cell is quantified by the number of discrete steps the memory cell can store. Higher resolutions are limited by the memory cell's capability to hold the stored charge, leakage to and from the cell, and accuracy of write, read, and other support circuitry. Other techniques for storing and retrieving data from analog memory cells are described in U.S. Pat. Nos. 5,694,356, 5,680,341, 5,745,409, 5,748,534, 5,748,533, 5,818,757, and U.S. provisional patent application Nos. 60/091,326 and 60/116,760, which are incorporated by reference.

The degree of precision for storing information in a memory cell can be selected by the design to be appropriate for a particular application. The degree of precision may be a user-selectable option. For example, when storing voice signals, relatively less precision is needed since the human voice is understandable and recognizable when less resolution is employed. As an example, for human voice, the memory cell can be designed to store about $2^8$ or 256 levels. For some applications, such as high-resolution color images, photographs, and video, greater precision is often necessary for an accurate reproduction. The memory cell or multiple memory cells used in conjunction with another may be designed to store effectively $2^{24}$ or 16,777,216 levels in order to produce the colors accurately. The memory cell or cells may effectively store $2^{16}$ or 65,536 levels if less color accuracy is acceptable.

In short, the memory cell or multiple memory cells of the present invention can be designed to store any number of levels, for example, $2^8$, $2^{10}$, $2^{12}$, $2^{14}$, $2^{15}$, and others. Other numbers of levels are also possible. A greater number of levels permits greater compression of data into a fewer number of memory cells. The greater number of levels each memory cell is capable of storing, the more data that can be stored in an array of these analog memory cells. The ultimate precision of the memory cell available with the analog memory cell depends on many factors such as the process technology used, stability, precision, and speed of the write and read circuitry used to store and resolve the different levels.

Using present technology, it is practical to implement an integrated circuit according to the present invention having memory cells, each capable of storing about $2^8$ number of levels. A memory system with $2^8$ bits of resolution is readily manufacturable and can be easily interfaced with and processed using the circuitry of the present invention. Further, a memory cell with $2^8$ resolution provides adequate resolution for recording and playback of voice data with a relatively high fidelity. As technology further improves, the present invention may be used to provide an interface with memory cells having greater than $2^8$ resolution.

Furthermore, instead of storing a data sample of the input signal into a single cell, multiple cells of the present invention may be combined to increase the resolution. Additional cells may be added until the desired resolution is achieved. Generally the relationship for providing greater resolution by using multiple cells is given by $2_{n \times m}$, where n is the number of memory cells and m is the bit resolution per cell. As can be seen, by using multiple analog memory cells of the present invention to store data, each additional cell provides an order of magnitude increase in precision. For example, three cells having $2^{10}$ resolution may be combined to have an effective resolution of 30. The number of bits resolution for multiple cells may be given by the following relationship, $2^{n \times 10}$, where n is the number of cells, and assuming each cell provides $2^{10}$ bits of resolution. As a further example, for three cells each having $2^8$ resolution, the combined effective resolution is $2^{24}$ (i.e., $2^{n \times 8}$ where n is 3). This may be useful for imaging applications, where each cell may correspond to the intensity of one of the red (R), green (G), and blue (B) parameters.

Although sometimes referred to as an analog memory cell, the memory cell of the present invention may also be used for applications other than analog applications. The memory cell can also be used in digital applications. The analog memory cell capable of storing multiple levels (or continuous levels) is equally well suited for digital and analog applications. For digital applications, the techniques of the present invention will permit much more compact storage of digital data. For example, the present invention may be used to implement nonvolatile mass storage PCMCIA or PC Cards. For analog applications, analog values may be stored into the memory cell without the need for an analog-to-digital (A/D) converter. For digital applications, discrete levels may be stored, and a D/A converter may be utilized.

FIG. 3 shows a simplified block diagram of the integrated circuit memory 200 with analog or multilevel memory cells of the present invention. Data comes in both digital and analog forms. It is desirable to have a integrated memory device capable of storing both analog and digital data. Some applications where analog and digital data are frequently intermixed are electronic answering machines and voice recorders. Voice messages and notes will be in analog form. Dates, times, message numbers, telephone numbers will be in digital form. The integrated circuit of the present invention permits the storage and retrieval of data in analog and digital forms. An analog input 305 is coupled to the ANAIN input (i.e., ANAIN+ and ANAIN− for a differential input signal). A digital input 310 is coupled to DI. An shift clock or SCLK input 315 is coupled to SCLK to clock in data at DI or clock data out at an output DO. An analog output 325 is coupled to ANAOUT (i.e., ANAOUT+ and ANAOUT− for a differential output signal). A digital output 325 is coupled to DO.

To store an analog signal, the signal is provided at the ANAIN input. The analog signal is sampled at a particular sampling frequency. These samples are stored in the memory cells of the integrated circuits. Typically, each memory cell will hold a single sample of the analog signal. However, in cases were greater precision is desired, two or more memory cells can be used in combination to hold a single sample. A procedure that is essentially the reverse of the storage procedure is used to retrieve and reconstruct the stored analog signal. In short, circuitry determines the analog signal equivalent for each stored sample, and these analog signal equivalents are streamed or "played back" at the originally stored sampling frequency. In an embodiment, the memory cells are nonvolatile cells such as Flash, EPROM, EEPROM, and other floating gate technologies. The present invention is also applicable to other memory cell technologies, both nonvolatile and volatile.

The sampling frequency used may be preset in the design of the integrated circuit. For example, the integrated circuit may sample using a sampling frequency such as 4 kilohertz, 5.3 kilohertz, 6.4 kilohertz, 8 kilohertz, or other frequencies. These frequencies may be selected at the fabrication facility by using the appropriate mask. However, once the chip is fabricated, the user cannot change its sampling frequency. In other embodiments, this sampling frequency is selected by the user. For example, the integrated circuit may use any one of the sampling frequencies such as 4 kilohertz, 5.3, kilohertz, 6.4 kilohertz, 8 kilohertz, or other frequencies that the user selects. One technique for a user to indicate the selected sampling frequency is by varying the size of an external resistor (or other component such as a capacitor or inductor) connected to an input of the integrated circuit. Another technique is for the user to configure or program storage locations or memory cells in the integrated circuit to indicate the use of a particular sampling frequency. A further discussion of this feature is found in U.S. provisional patent application Nos. 60/091,366 and 60/116,760.

Using this approach, the sampling frequency can be dynamically changed during the operation of the integrated circuit. For example, two messages may be stored using different sampling frequencies within the same integrated circuit. The user may select a high sampling frequency for higher fidelity and a lower sampling frequency for lower fidelity. At a lower sampling frequency, a longer duration of a voice signal may be stored using the same memory capacity. This change in sampling frequency is made simply by electronic control and selection, without physically changing the circuit board.

A user can select the sampling frequency by inputting data to the integrated circuit. The data can be binary bits input in parallel or in series to indicate what sampling frequencies the user desires. This sampling frequency selection is stored on-chip in a register or other memory, and possibly in nonvolatile memory cells. In a specific implementation, the user-selectable sampling frequency is selected by using an SPI interface of the integrated circuit. The SPI interface and SPI commands are discussed further in U.S. provisional patent application No. 60/091,326. In this embodiment, the same pins (e.g., DI) used to input the digital data to be stored in the analog memory cells are also used to input the selection of the sampling frequency. For example, the user may input a serial string of bits, such as 001000000000000000010 at the DI input pin to indicate a sampling frequency of 8 kilohertz will be used. For writing of digital data, the digital data is input at DI.

The user-selectable sampling frequency feature in the present invention is implemented through an SPI "PWRUP" command, which is a power-up instruction. The first five bits "00100" in the SPI string is the op code for PWRUP. PWRUP resets the device to initial conditions and sets the sampling frequency and divider ratios. The op code is followed by a string of fifteen bits, A14 to A0. The A1 and A0 bits select the internal sampling frequency. For A1 and A0 of 00, respectively, a 6.4 kilohertz sample rate is selected. For 01, the sample rate is 4.0 kilohertz. For 10, the sample rate is 8.0 kilohertz. And for 11, the sample rate is 5.3 kilohertz.

To store digital data, the digital bits are input at DI and clocked into the memory cells using SCLK. The digital bits are stored in the memory cells of the integrated circuit. These memory cells are in the same memory array of the integrated circuit used for analog signal storage. Therefore, with 1.92 million cells, the integrated circuit will store a maximum of 1.92 million digital bits, and no memory cells will be left for analog storage. The total number of cells used for digital storage (DS) and the total number of cells use for analog storage (AS) should not exceed the total number of memory cells (TS), i.e., DS+AS≦TS.

Although only a single DI pin is shown, there may be any number pins for parallel digital input. For example, for parallel input of eight bits or a byte of data, the integrated circuit may have digital input pins DI0 through DI7. For sixteen bits, there will be pins DI0 through DI15. With a single DI pin, digital data is input one bit at a time or serially. In an embodiment of the present invention where there is a single digital input pin DI, the memory may be used like a serial memory. In particular, if the memory has nonvolatile cells such as Flash or EEPROM cells, the integrated circuit would handle digital data similarly to a serial EEPROM or serial EPROM. Also, the integrated circuit may be used like a first-in, first-out (FIFO) memory.

An application of an integrated circuit of the present invention is to serve as nonvolatile analog storage and also as nonvolatile digital data in an electronic system. For example, since volatile integrated circuits lose their stored data after power down, when these integrated circuits are powered up, they need to be reconfigured with the appropriate data. The analog memory integrated circuit may serve as a source of nonvolatile digital configuration data. This digital data is loaded from the analog memory into other devices of the system upon power-up of the system. These volatile memory devices (e.g., SRAMs, DRAMs, FPGAs, PLDs) may use SRAM, DRAM, or other volatile technologies. Therefore, another nonvolatile storage device such as an additional parallel of serial EPROM is not needed in the system. This saves valuable printed circuit board space.

Furthermore, the digital storage of the present invention can be used to store frequently used numbers, word, or sound bites. For example, information such as the days of the weeks (i.e., Sunday, Monday, Tuesday, Wednesday, Thursday, Friday, Saturday), ordinal numbers one through fifty-nine (e.g., one, two, three, four, and so forth), and DTMF sounds, may be digitally stored or stored in analog. These types of information will be retrieved and linked together as needed by the electronic system to provide information messages such as: "You have three new messages. Message one was received on Tuesday at 3:15 p.m." This sound bite or message linking scheme will greatly ease the re-use of the commonly used sound bites and reduce the amount of memory used.

FIG. 4 shows a block diagram of the circuitry for an embodiment of an integrated circuit of the present invention. There is an analog input 405 and digital input 407. The data at the analog input is sampled using a sampling clock 410. As discussed above, this sampling clock may be an on-chip programmable oscillator allowing the user to select a desired sampling frequency. The digital and analog inputs are connected to a multiplexer 412 to selectively pass the digital or analog data to a write circuit 414. Write circuit 414 is the circuitry that stores the digital or analog data into memory cells 416. In the case of Flash or EEPROM cells, the write circuit 414 will generate the high voltages needed to configure these cells. The write circuit includes circuitry to erase and program the memory cells. In some embodiments, the memory cells may need to be erased before storing new data.

In one embodiment, the write circuit includes a level shifter circuit. The level shifter circuit takes its analog input and generates a level shifter output voltage in a voltage range suitable for storing the analog level. The level shifter output voltage is the threshold voltage (VT) the nonvolatile memory cell will be configured to store. Some embodiments for the write circuitry are described in U.S. provisional patent application Nos. 60/091,326 and 60/116,760 and also U.S. Pat. Nos. 5,694,356, 5,687,115, and 5,745,409, which are incorporated by reference.

Multiplexer 412 is be implemented using one of the many techniques used to implement a multiplexing function to pass analog voltage levels in an integrated circuit. The multiplexer may be implemented using transmission gates with control signals connected to control nodes (e.g., gates) of the pass transistors. Another example of a multiplexing circuit is a summing amplifier, where the unselected input or inputs are set to zero.

A control input 418 of multiplexer 412 controls whether analog or digital data is connected or passed to write circuit 414. There are many different techniques of controlling control input 418. For example, control input 418 may be controlled by an external input to the integrated circuit, such as commands given through a serial port interface (SPI). Further details of a SPI interface and SPI commands are described in U.S. provisional application No. 60/091,326. The signals provided through the SPI interface may be from an external device, such as a controller or microprocessor. Another technique to control multiplexer 412 is to detect activity on the analog or digital input pin, and store digital or analog data depending on which pin has activity. In the case when both pins are active at the same time, priority may be given to the analog or digital input pin, and the other pin can be buffered. Alternatively, the integrated circuit can generate a "busy" signal to indicate it cannot accept data on the digital or analog input pin.

In a specific implementation of an SPI interface in present invention, to handle digital data, there are DIG_ERASE, DIG_WRITE, and DIG_READ commands. The DIG_ERASE command (op code 01010) erases all data contained in the sector specified by a sector address of bits A14 to A0. The DIG_ERASE step is required to erase a sector before writing new data into the memory cells using DIG_WRITE command. However, to store new analog data, there is a built-in automatic "look-ahead-erase" step to erase the old analog data of the selected sector before writing the new analog data into the memory cells.

The DIG_WRITE command (op code 01011) stores 3K bits of digital data in the specified sector. Digital data is input at DI. In an implementation, all 3K bits of a sector must be written, and no partial usage of the sector is allowed. When digitally writing to the memory cells, all memory cells in a sector are written to, whether or not the user has enough digital data to occupy the entire sector. The "extra" memory cells in a sector are written with some digital value such as a 0 or 1. This technique of writing all the memory cells in a sector improves the reliability and increases the longevity of the memory cells. The reason is that a digital erase erases all the memory cells in a sector, and is performed before each digital write. Therefore, if only the sector is partially written during the digital write, and the other cells are left in the erased state, these other cells may become "overerased" if on many subsequent erase and write cycles these cells are never written. An overerase condition for the memory cells is undesirable because overerased memory cells may fail subsequently to read or write. Consequently, the technique of requiring every cell in a memory sector to be written will prevent the overerase condition from occurring. There are many variations of this technique to achieve the same purpose of preventing overerase.

The DIG_READ command (op code 01111) instructs the device to retrieve digital data that was previously written to the specified sector. The memory acts like a first-in first-out (FIFO) memory, where the first data bit shifted in will be the first data bit shifted out (at DO). The first bit shifted out is the first bit that was written. The last bit shifted out is the last bit that was written.

In an implementation, the SPI interface is used for both selection of the sampling frequency and providing the digital data. This provides a familiar and consistent user interface.

A sector of the present invention is a grouping of memory cells in the array. The sector can have any number of memory cells. In an embodiment of the present invention, a sector size is 3K cells. The arrangement of the memory cells is discussed further below in connection with FIGS. 7 and 8. FIG. 8 shows a portion of a sector of memory cells. All the memory cells in a sector have a common source line (SL). By sharing a common source line, all the cells in one sector can be erased at one time.

In the digital data path, between digital input 407 and multiplexer 412 is circuitry including a register or storage device 420 and a D/A converter 425. This register or storage device can be implemented using flip-flops, memory cells, and other storage circuits. For example, register 420 may be a FIFO or shift register. The register stores the digital data from the digital input. The digital data is clocked in using a clock input 430 (e.g., SCLK). From the register, the data is output to D/A converter 425 that generates an analog signal representation of the digital data. This analog signal representation will be passed through multiplexer 412 to write circuit 414 for storage into the memory cells. The same write circuitry used to store the analog data will also store the digital data.

By using the same write circuit for analog and digital writes, the digital data is stored in the memory array using a scheme that is consistent with analog data. Among the advantages of these scheme are that there does not need to be separate tuning or tweaking of separate write circuitries. Layout space is saved on the integrated circuit and power consumption is reduced.

The D/A converter may also be referred to as a digital reference generator. For each different digital value, the D/A converter will generate a unique, corresponding analog value equivalent. For example, for a single digital bit, the D/A converter may generate an analog voltage of about 6.5 volts for a logical 1 input and an analog voltage of about 3.5 volts for a logical 0 input. For a 2-bit digital value, the D/A converter will generate four different analog value equivalents. Therefore, for an n-bit digital value, the D/A converter will generate $2^n$ different analog values. The exact analog voltages the D/A converter or digital reference generator generates depends in part on the range of analog voltage inputs into the integrated circuit and the range of voltage thresholds that can be programmed into a memory cell.

In an embodiment, this D/A converter is designed to provide a relatively large voltage margin between each of the analog voltage equivalents. This is analogous to having a D/A converter with a large step size. A large margin will improve the integrity of the stored data because it will be easier to distinguish between one digital value and another. This will improve noise immunity and also increase the longevity of the integrated circuit, characterizing or lessening the impact of changes or degradation of the characteristics of the memory cells over time. For the case of an analog floating gate memory cell, the cell is configurable to have a threshold voltage or VT in a range or band. For example, the memory cell may be configured to have a stored VT from about 3.5 volts to about 6.5 volts. When storing a single bit of data, the greatest amount of margin is obtained when the stored VTs for 0 and 1 are at the ends the range, for example, 3.5 volts and 6.5 volts. This will permit the greatest amount of margin. Generally, when storing n bits of data, the greatest amount of margin is obtained by evenly dividing the range into $2^n$ different analog values. However, due to differences in possible memory disturb mechanisms or leakage of the stored charges, or both, associated with different VTs and different read and write conditions, the levels or step sizes can be nonuniform. The D/A converter generates the voltages for the write circuit so the digital data is stored in the memory cells to the appropriate VTs.

FIG. 5 shows another more detailed diagram of an embodiment of the digital input path circuitry. Data from the digital input is clocked into a 2-bit shift register 510 using clock input 430. Shift register 510 includes individual registers 520 and 522. Although FIG. 5 only shows a 2-bit register, a larger shift register can be formed by connecting the output from one shift register into the input of another, and so forth. Data is serially shifted into the shift register from SPI input DI pin. The shift register is connected in parallel to D/A converter 425 through lines 531 and 533. This permits input of parallel digital data to the D/A converter to more rapidly determine the corresponding analog equivalent value.

FIG. 6 shows another embodiment of the digital input path circuitry. This embodiment illustrates parallel input of digital data onto the integrated circuit. There are two digital input pins DI0 and DI1. Digital data is clocked using clock input 430 into a 2-bit register 610. Register 610 is connected to output the digital data in parallel to D/A converter 425. A parallel connection to the D/A converter allows more rapid conversion of the digital data to an analog representation, since the conversion occurs by using many bits at one time.

The analog and digital data are stored in the memory cells. The same memory cell that is used to store analog data may also be used to store digital data on a different occasion. Each memory cell can store anywhere from a single bit of digital data to multiple bits of digital data. For example, the memory cell of the present invention can store two, three, four, five, six, seven, eight, or more bits of data. Similar considerations as discussed above for the storage of analog data in a memory cell also apply to the multilevel storage of digital data in a memory cell. As is expected, there will be greater noise margins if fewer bits are stored per memory cell. A single bit of storage per memory cell is easily implemented and provides the greatest noise immunity. Greater storage densities are desirable, and approximately six bits of digital storage per memory cell is feasible using the techniques and circuitry of the present invention. As technology improves, the techniques and circuitry of the present invention can be extended to eight, nine, ten, eleven, twelve, thirteen, fourteen, fifteen, sixteen, and more bits of storage per memory cell.

There are many possible arrangements for memory cells 416 in an integrated circuit of the present invention. For example, the memory cells may be arrayed in rows and columns and divided into sectors. FIG. 7 shows one specific example where the memory cells are organized in subarrays. Subarrays on a left side are labeled LA, LB, LC, and LD. Subarrays on a right side are labeled RA, RB, RC, and RD. A subarray has row or word lines (WLs) and column or bit lines (BLs). A subarray may be further segmented in sectors. A sector of memory cells may have different bit lines and they share the same source line (SL). This permits the erasure of a sector of memory cells at one time using the common source line. An example of a configuration for a sector of memory cells is shown in FIG. 8.

In FIG. 8, there are three word lines (or row lines) WL1, WL2, and WL3 of memory cells. For example, memory cells M11 and M12 to M1n are connected to WL1. A word line may have as many or as few memory cells as desired. In a specific implementation, each word line has 640 cells. There may also be any of word lines in a sector WL1 to WLM. A column of memory cells is connected to a bit line. This figure shows bit lines BL1 and BL2 to BLn. Each bit line may have as many memory cells as desired. One source SL is connected to the source connections of all the memory cells for this sector.

In a specific implementation of a sector of memory cells, there are a total of 1504 cells which are organized as 376 word lines by 4 bit lines. Therefore, n will be 4 and m will be 376. This organization for a sector of the array provides efficient storage for analog data such as voice, sounds, and music. The memory cells in a sector may be erased at one time because a high erase voltage (e.g., $V_{erase}$) is provided to the sources of all cells at the same time. The cells are erasable using quantum mechanical tunneling. Other configurations and organizations for a sector can be used. A sector may have more or less than 1504 cells and have any number of row lines and column lines.

There is circuitry for a Y-address decoder 710 for the subarrays on left side, and for a Y-address decoder 720 for the right side. Further, there are X-address decoders 730 and 740 for the each of the subarrays. The X-address decoders are located between the subarrays. There are global bit line decoders 745 and 747 for left and right subarrays, respectively. The subarrays have local bit line and source line select circuitry 752 and source decode to $V_{erase}$ circuitry 755. Also, there is a word line pull-down decoder group 760 for each of the subarrays. The decoders may be divided into pull-up and pull-down decoders, or all decoders may be on one side, either the pull-up or pull-down side. In a specific embodiment of the present invention, decoders 740 are pull-up circuitry while decoders 750 are pull-down circuitry.

In present invention, within each subarray, one word line may be designated as an end of message (EOM) word line (i.e., EOM WL) that may be used to gate memory cells to indicate whether a recorded message ends within a sector. Also, there may be a trim word line (i.e., TRIM WL) in one or more of the subarrays. The trim word line may include memory cells that are configured to enable or disable options or other configurations for the integrated circuit. These on-chip configurable trim cells can greatly enhance the product manufacturability yield and chip performance by customizing different trim settings for each integrated circuit chip. The memory cells along the trim word line may be one-time programmable. These cells may be standard floating cells that are made one-time programmable by not providing circuitry for erase and reprogramming of the cells.

FIG. 4 further shows the circuitry in the integrated circuit for retrieving analog and digital data from the memory cells. A read circuit 445 retrieves the information stored in the memory cells by determining stored VTs. Some embodiments for the write circuitry are described in U.S. provisional patent application Nos. 60/091,326 and 60/116,760 and also U.S. Pat. Nos. 5,638,320, 5,751,635, 5,748,534, and 5,748,533, which are incorporated by reference.

The data stored in the memory cells will be analog or digital data. If analog data, a decoder 450 will selectively pass the retrieved analog signal to an analog output 454. The reconstructed analog signal will be played back at the analog output. The analog signal is played back at a playback frequency which is typically the same as the sampling frequency. As is the sampling frequency, the playback frequency is user selectable. If digital data, the decoder will selectively pass the data to an A/D converter 459 to obtain the original digital value. This digital value is output at a digital output 463. Furthermore, in an embodiment, by using control input 467, the signal from the read circuit 445 may be passed to both analog output 445 and A/D converter 459 at the same time. One of the uses of this simultaneous output feature is for testing purposes. Control of the decoder is by way of a control input 467. Control input 467 determines whether the output from read circuit 445 is passed to the analog or digital output circuitry. Control input 467 may be controlled through the SPI interface or through internal circuitry, such as an on-chip controller, that maps what type of data each memory cell is storing.

An external microcontroller may maintain a mapping table of which memory cells store analog data and which store digital data. However, in more highly integrated embodiments of the present invention, the memory integrated circuit includes the mapping circuitry or controller on-chip. For example, the memory integrated circuit of the present invention may also include an array of SRAM memory or registers that will be an address mapping table. This mapping table would control addresses of the nonvolatile memory where messages and data are stored and the length of the stored information. The mapping table also stores whether the information is analog or digital. The content of the SRAM table may be stored in the on-chip nonvolatile memory and load the data into volatile SRAM upon power-up.

A/D converter 459 determines the corresponding digital representation for an analog input value. Its function is essentially the reverse of that of D/A converter 425. There are many different circuit embodiments for A/D converter 459. Circuitry for one such embodiment is shown in FIG. 9. When there is a single stored digital bit per cell, one technique is to use a sense amplifier 908, or a comparator, to detect whether the stored analog value 912 is above or below a reference voltage 919. This reference voltage is selected to be in the middle between the analog voltages for a 1 and 0. For example, if a 1 is 6.5 volts and a 0 is 3.5 volts, the reference voltage should be about 5 volts. If the stored analog value is above this reference value, the digital output is a 1 at 924. VDD or another appropriate voltage is provided at digital output 924. If the stored analog value is below the reference voltage, the digital output is a 0. Ground or another appropriate voltage is provided to the digital output.

In the case n bits are stored per cell, a multilevel sense amplifier or sensing technique would determine which of the $2^n$ digital values corresponds to the stored analog value. The circuitry may include a single sense amplifier or series of sense amplifier working together. When multiple sense amplifiers are used, the sense amplifiers can operate in series or in parallel. In a series implementation, the signal is connected through a number of sense amplifiers arranged serially. In a parallel implementation, the signal is connected to a number of sense amplifiers arranged in parallel. Of course, some circuit implementations of the sense amplifier may include both serial and parallel arrangements.

The sense amplifier or sense amplifiers detect multiple stored levels and generate the appropriate digital value. Circuitry such as the level detection circuitry used in the VCC voltage level detection circuitry of the present invention, discussed in U.S. provisional patent application Nos. 60/091,326 and 60/116,760, may be adapted and used to retrieve the digital values stored in the analog memory array.

FIG. 10 shows a further embodiment of circuitry for the digital output path. The stored analog value 1012 is input into a look-up table (LUT) circuit 1016. The look-up table circuitry provides an analog look-up table function. For each analog value in the table, there is a corresponding digital value. The look-up table outputs this digital value. In an embodiment, the look-up table may be implemented using sense amplifiers, arranged in parallel or series. For example, this may be a 4-bit digital value in the case four bits are stored in each memory cell. The digital value may be output to a register 1022 in parallel or serial. The digital data may be clocked out to a digital output 1028 using clock input 1024 in parallel or serial.

FIG. 11 shows a circuit diagram of an implementation of a D/A converter or digital reference generator for analog memory storage. As discussed above, the digital reference generator permits storage of binary or digital data in the memory array using the same write and read circuits, and the digital scheme is consistent with the storage of analog data. This implementation of the digital reference generator generates analog equivalents for a single bit of digital data.

The digital reference generator includes a digital data input circuit 1110 and bias voltage generator circuit 1160. Digital data is input at a digital data input 1114. An analog output equivalent to the digital data is output at OUT 1147 and NOUT 1149. OUT and NOUT are differential outputs of the digital reference generator. A differential output signal for the digital reference generator is needed in the case when the analog signal path in the integrated circuit is differential. In a memory integrated circuit such as in FIG. 4, OUT and NOUT are connected to write circuit 414, and more specifically, a level shifter circuit.

Digital data input 1114 is connected to inverters 1117 and 1119. Digital data input 1114 and inverters 1117 and 1119 are connected to control four transmission gates 1132, 1134, 1136, and 1138. In a specific embodiment, each of the transmission gates is implemented using an n-channel or NMOS transistor and a p-channel or PMOS transistor connected in parallel. There are two control inputs to each transmission gates, one to the gate or control electrode of the NMOS transistor, and one to the gate or control electrode of the PMOS transistor.

Inputs of transmission gates 1132 and 1138 are connected to a first bias voltage line 1143. Inputs to transmission gates 1134 and 1136 are connected to a second bias voltage line 1145. Outputs of transmission gate 1132 and 1134 are connected to an OUT output 1147. Outputs of transmission gate 1136 and 1138 are connected to an NOUT output 1149. Digital data input 1114 control the transmission gates to pass the bias voltages as summarized in the following table A.

TABLE A

| Digital Data Input | OUT | NOUT |
| --- | --- | --- |
| 0 | Second Bias Voltage | First Bias Voltage |
| 1 | First Bias Voltage | Second Bias Voltage |

In a specific embodiment, the first bias voltage is about 0.2 volts above a reference voltage R and the second bias voltage is about R−0.2 volts. In this case, for a digital 0, the digital reference generator generates OUT and NOUT of R−0.2 volts and R+0.2 volts, respectively. For a digital 1, OUT and NOUT will be R+0.2 and R−0.2 volts, respectively. There will be a 0.4-volt difference OUT and NOUT. Reference voltage R will be in the middle, between the first and second bias voltages. These voltages at OUT and NOUT will correspond to, for example, the 3.5-volt and 6.5-volt stored threshold voltages for the memory cells. The write circuitry will perform the necessary level shifting to configure the memory cells properly.

For a differential analog signal path, the digital reference generator should provide a differential output consistent with this differential scheme. The OUT and NOUT outputs should be symmetrical about the reference voltage R, which is typically a signal ground. In a specific embodiment, the signal ground is about 1.23 volts, which may be generated using a bandgap reference generator. When a single-ended analog input is used, the digital reference generator circuitry may be appropriately modified to provide a single-ended output. For example, only an OUT or NOUT output will be provided.

Bias voltage generator circuit 1160 generates the first and second bias voltages 1143 and 1145. The circuitry includes transistors 1162, 1164, 1166, 1168, and 1170, connected in series between a positive supply voltage VDDA and a reference supply voltage VSSA. VDDA and VSSA are supply voltages for the analog circuits while VDDD and VSSD are supply voltages for the digital circuits. Typically, VDDA is about 3 volts and VSSA is ground. Separate digital and analog supply pins are provided to give some noise immunity between the digital and analog circuits. Noise from the digital circuits will not couple to the analog circuits, and vice versa. Transistors 1162 and 1164 are PMOS devices. Transistor 1162 has a gate connected to a VSP bias voltage and transistor 1164 has a gate connected to a VSPC bias voltage. Transistor 1166 is diode-connected NMOS device, connected between first bias voltage line 1143 and second bias voltage line 1145. Transistors 1168 and 1170 are NMOS devices. Transistor 1168 has a gate connected to a VSNC bias voltage and transistor 1170 has a gate connected to a VSN bias voltage.

In an implementation, transistor 1166 is a native type NMOS transistor, which means this device is not doped with a threshold adjust implant (or other implant) as are the other standard enhancement type NMOS transistors on the integrated circuit. The threshold voltage (VT) of a native NMOS device will be typically about 0.4 volts. In comparison, a standard NMOS device will have a VT typically about 0.7 volts. The VT of device 1166 provides the voltage difference between the output lines 1143 and 1145. A native device is used for transistor 1166 in order to obtain about a 0.4-volt difference between the two bias voltages 1143 and 1145. Depending on the particular implementation and the desired separation between the bias voltages, other types of devices, diodes, bias current level, and transistors with different VTs may be used in place of a native device. For example, if a 0.7-volt difference between bias voltages 1143 and 1145 were desired, a standard NMOS transistor may be used as a device 1166. Two or more transistors may be connected in series and placed between nodes 1143 and 1145 to give a greater voltage separation between the bias voltages. A 1.4-volt difference is obtained by using two standard NMOS transistors between nodes 1143 and 1145.

In an implementation, VSP will be about VDDA - VT, VSPC will be about VDD - 2*VT, VSNC will be about 2*VT above VSSA, and VSN will be about a VT above VSSA, where VT is the threshold voltage of an NMOS transistor. The VSP, VSPC, and VSNC voltages will be provided by a bias generator. This bias generator may be a slave bias generator in a master-slave bias voltage generating scheme, as discussed in U.S. provisional application No. 60/091,326. VSN may also be provided by a slave bias generator circuit.

In an embodiment, the digital reference generator includes a common mode feedback (CMF) circuit 1201 such as shown in FIG. 12. In such a case, VSN in FIG. 11 is generated by the common mode feedback circuit. The common mode feedback circuit connects to OUT and NOUT of the digital data input circuit 1110 of FIG. 11 as input to CMF circuit and generates output CMF, which connects to the VSN of FIG. 11. The common mode feedback circuit regulates the OUT and NOUT voltage levels by feeding back and adjusting the VSN voltage. VSN is connected to the gate of transistor 1170, which acts like a current source. If changes occur at OUT and NOUT outputs of circuit 1110, the common mode feedback circuit adjusts VSN (i.e., control of the current source) to compensate so the bias voltages at 1143 and 1145 will be centered about the reference voltage R. By using common mode feedback, the digital reference generator will provide a consistent analog output with reference to a reference voltage R.

Common mode feedback circuit 1201 has an OUT and NOUT input that is connected to the OUT and NOUT output of FIG. 11. CMF is an output connected to VSN (i.e., the gate of transistor 1170) of FIG. 11. In circuit 1201, OUT and NOUT are connected to capacitors 1203 and 1205, respectively. Within an integrated circuit, there are many techniques of implementing a capacitor or a capacitance, and any of those techniques may be used to implement the capacitors or capacitances used in the circuitry of the present invention. Some techniques for implementing capacitors and capacitances include using parasitic capacitances, transistors, oxide capacitors, and diffusion capacitors, just to name a few. In this implementation capacitors 1213 and 1217 are about 0.8 picofarads. Other capacitors sizes may be used. Bigger capacitors sizes than 0.8 picofarads will speed up changes or adjustments in the CMF voltage during operation.

The common mode feedback circuitry further includes transmission gates 1213, 1215, 1217, 1223, 1225, and 1227. These transmission gates are connected to SET, SENS, NSENS, and NSET control inputs. The circuitry includes two more capacitors 1233 and 1235. Capacitors 1233 and 1235 are typically smaller than capacitors 1203 and 1205. For example, capacitors 1213 and 1217 are about 0.2 picofarads. A signal ground SG input is coupled through transmission gates 1223 and 1213 to OUT, and through transmission gates 1227 and 1217 to NOUT. A VBIAS input is connected through transmission gates 1225 and 1215 to CMF.

SG is a signal ground voltage. In an implementation, this is connected to a 1.23-volt bias voltage generated by a bandgap voltage generator. Other voltages may be selected to fit a particular application. SG is the R or center voltage about which bias voltages 1143 and 1145 will be centered. Typically, the same SG voltage is used for other circuits such as the write and read circuits on the integrated circuit to provide a consistent reference. For example, this will allow the digital reference generator to track similarly with the write circuit or level shifter up circuit and with read circuit or level shifter down circuit. The complete circuit system will reliably operate despite variations in operating conditions and process.

VBIAS is be a bias voltage of about VT (above VSSA). This voltage may be generated using a slave bias generator.

In operation, the common mode feedback circuit regulates and adjusts the CMF voltage based on OUT and NOUT inputs. SENS, NSENS, SET, and NSET are switch control inputs connected to clock signals. NSENS is the complementary signal of SENS, and NSET is the complementary signal of NSET. Consequently, transmission gates 1213, 1215, 1217, 1223, 1225, and 1227 are repeatedly switching based on the SENS, NSENS, SET, and NSET clock signals.

For proper operation, clock signals SENS and NSENS are nonoverlapping with respect to SET and NSET, respectively. This will prevent undesirable situations such as shorting of inputs. For example, it is undesirable for the SG input to electrically short to the OUT input. Nonoverlapping means that the clock signals will not be both in a particular logic state (e.g., high or low) at the same time that may short two different inputs. For example, it is desirable for both SENS and SET not to be high at the same time. Similarly, it is desirable for NSENS and NSET not to be low at the same time.

While SENS, NSENS, SET, and NSET are switching, node N2 will be common with N1 and N3. So, N2 will be at the SG voltage. Through switch 1215, N2 and CMF will be equalized. The common mode feedback circuit compensates for changes at OUT and NOUT of circuit 1110 of FIG. 11 by adjusting CMF (VSN of FIG. 11), which will ultimately adjusts the OUT and NOUT. First bias voltage 1143 and second bias voltage 1145 of bias voltage generator 1160, and in turn, the OUT and NOUT outputs will be centered around the SG voltage. This digital reference generator circuit with common mode feedback is efficient, robust, and reliable.

The scheme in FIGS. 11 and 12 shows the generation of analog equivalent for a single digital bit. Similar techniques are used to generate analog equivalent values for two or more bits of digital values. FIG. 13 shows a diagram of circuitry for a digital reference generator with common mode feedback for a generalized number of digital bits n. For n digital bits, there will be $2^n$ different analog equivalents. For example, for two bits, there will be four different analog equivalents that will be stored in a single analog memory cell. For three bits, there will be eight different analog equivalents. For eight bits, there will be 256 different analog equivalents.

The digital reference generator has a digital data input circuit 1320, bias voltage generator circuit 1325, and common mode feedback circuit 1330. Digital data input circuit 1320 receives n digital bits of input and a number of bias voltage inputs. Each of the bias voltage inputs is at a unique voltage level. Digital data input circuit 1320 generates the $2^n$ different analog equivalent outputs at OUT and NOUT.

The number of different bias voltage inputs to circuit 1320 depends on the scheme used. For one scheme, similar to that described above for FIGS. 11 and 12, the voltages passed to OUT and NOUT will be selected from combinations of the bias voltage inputs 1 to j. For example, for three bits of digital input and j equal to 8, table B summarizes OUT and NOUT outputs and the bias voltage (BV) input at OUT and NOUT.

TABLE B

| Digital Data Input | OUT | NOUT |
| --- | --- | --- |
| 000 | BV Input 4 | BV Input 5 |
| 001 | BV Input 3 | BV Input 6 |
| 010 | BV Input 2 | BV Input 7 |
| 011 | BV Input 1 | BV Input 8 |
| 100 | BV Input 5 | BV Input 4 |
| 101 | BV Input 6 | BV Input 3 |
| 110 | BV Input 7 | BV Input 2 |
| 111 | BV Input 8 | BV Input 1 |

Table B shows only one particular set of combinations of analog voltage equivalents. With eight different bias voltage inputs, many possible unique combinations (i.e., n*(n−1)) of analog equivalent voltages are possible. For three bias voltage inputs, there will be six different combinations. For four bias voltage inputs, there will be twelve different combinations. Although there are many unique combinations of analog voltage equivalents for a number of given bias voltage inputs, it is not necessarily desirable to use circuitry that minimizes the number of bias voltage inputs. It is generally desirable to select analog equivalent voltages to allow the most reliable storage of digital data in the analog memory cell. Therefore, it is desirable to select the analog equivalent voltages so the spacing of the stored threshold voltages for the memory cell will permit other circuitry to distinguish relatively easily between the different stored states. Also, the difference between on analog equivalent levels are spaced sufficiently from each other will maximize the longevity of the stored data in the cells. For example, charge leakage over time may alter the memory contents retrieved from the cells if the analog equivalent levels are spaced too closely together.

The implementation in table B uses analog equivalents where the voltages are the inverse of another. For example, the analog equivalents for digital data input 000 and 100 in table B are inverses of each other. It other implementations of the invention it may be desirable not to use analog equivalent voltages that are the inverse of another.

Bias generator 1325 generates bias voltages VB1 to VBj. The number j of bias voltages will vary depending on which analog equivalent voltage are selected. To generate j bias voltages, impedances R1 to Rj are connected in series with a current source 1350 between the supply voltages. This implementation is similar to the bias voltage generator circuit 1160 in FIG. 11. The bias voltages VB1 to VBj are taken at taps between the impedances.

Impedances R1 to Rj can be implemented in one of the many techniques used to provide impedances on an integrated circuit, including the use of transistors, resistors, memory cells, and others. A programmable impedance such as discussed in U.S. patent application No. 09/159,848, which is incorporated by reference, may be used. In an embodiment, the sizes of the impedances are the same. In another embodiment, in order to adjust the analog equivalent voltages as desired, the impedances may have different values.

As was discussed above, common mode feedback circuit 1330 is used to adjust the current source 1350 based on the OUT and NOUT voltages in order to keep the OUT and NOUT voltages centered about a signal ground.

FIG. 14 shows another implementation of a digital reference generator. The digital reference generator provides analog equivalent outputs OUT and NOUT that will be used by the write circuitry to store a digital value in the analog cell. This digital reference generator has a digital data input circuit 1420 and common mode feedback circuit 1430. A number of impedances R1 to Rn and a current source 1433 are connected in series between the supply voltages. In parallel with each resistor is a switch 1435. OUT and NOUT are taken from two taps in the impedance chain. There will be any number of impedances and parallel switches between OUT and NOUT. Also there may be impedances between OUT and NOUT without parallel switches, such as impedance K.

Each switch can be connected ("on") or disconnected ("off") depending on a control signal 1440 from a digital data input circuit 1420. When on, the switch shorts the impedance. Digital data input circuit 1420 receives a digital data input and generates an appropriate pattern for the control signals to determine which switches are on or off. Depending on whether particular switches are on or off, the value of the impedance between OUT and NOUT may be varied. Therefore, the voltage between OUT and NOUT is variable based on the digital data input. Using this technique, a number of analog equivalent voltages are generated.

The common mode feedback circuit 1430 operates as described above for the previous described digital reference generator implementation.

Impedances R1 to Rn are implemented using one of the many techniques for making impedances on an integrated circuit. Impedances R1 to Rn may be programmable impedances. In an implementation of the circuitry in FIG. 14, the impedances are all the same value. In another implementation, the impedances have different values. The impedance values are weighted such as by using a binary weighting. By using weighted impedances, many different impedance values may be obtained by combining the appropriate impedances R1 to Rn.

Table C below summarizes an implementation of the technique of FIG. 14. There are three impedances R1, R2, and R3, and the table shows the various combinations of impedances available to generate the different analog equivalent voltages. In this embodiment, there is a impedance K between the OUT and NOUT nodes. Even when all the impedances R1, R2, and R3 are shorted out, there will be a resistance K between OUT and NOUT.

TABLE C

| Digital Data Input | Impedance Between OUT and NOUT |
| --- | --- |
| 000 | R1 + K |
| 001 | R2 + K |
| 010 | R3 + K |
| 011 | R1 + R2 + K |
| 100 | R1 + R3 + K |
| 101 | R2 + R3 + K |
| 110 | R1 + R2 + R3 + K |
| 111 | K |

This detailed description of the invention is presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to utilize and practice the invention in various embodiments and with various modifications as are suited to the particular use contemplated. It is intended that the scope of the invention be defined by the following claims.

What is claimed is:

1. A method of storing information in a memory comprising the steps of:
   providing an analog signal at an analog signal input;
   providing digital data at a digital signal input;
   providing an array of memory cells;
   sampling the analog signal input at a user-selected sampling frequency;
   storing samples of the analog signal in the array of memory cells, wherein a memory cell holds at least one sample of the analog signal; and
   storing the digital data in the array of memory cells, wherein a memory cell holds at least a bit of the digital data.

2. The method of claim 1 wherein a memory cell holds at least two bits of the digital data.

3. The method of claim 1 wherein a memory cell holds at least six bits of the digital data.

4. The method of claim 1 further comprising the step of:
   serially clocking and storing the digital data into the array of memory cells.

5. The method of claim 1 further comprising the step of:
   providing a command at the digital signal input to select the user-selected sampling frequency.

6. The method of claim 1 wherein each memory cell in the array capable of storing analog data from the analog signal input is capable of storing digital data from the digital signal input.

7. The method of claim 1 further comprising the step of:
   converting the digital data into an analog equivalent representation, wherein storing the digital data uses the same write circuitry as storing the analog data.

8. The method of claim 1 wherein a write circuit used to store samples of the analog signal in the memory cells is also used to store the digital data in the array of memory cells.

9. The method of claim 1 wherein storing the digital data comprises:
   converting the digital data into an analog representation of the digital data;
   altering a threshold voltage (VT) of a memory cell to hold the analog representation of the digital data.

10. The method of claim 9 wherein the analog representation of the digital data has more than two analog voltage levels.

11. The method of claim 1 further comprising the step of:
    writing every memory cell in a sector of the array of memory cells with a digital value.

12. The method of claim 11 wherein a source line of every memory cell in the selected sector is coupled together.

13. An integrated circuit comprising:
    an array of memory cells;
    a write circuit to store an information provided at an analog input and a digital input of the integrated circuit into the memory cells, wherein the information provided at the analog input is in an analog form and at the digital input is in digital form; and
    a multiplexer, coupled between the analog input and the write circuit, and the digital input and the write circuit, to selectively couple the analog input to the write circuit or the digital input to the write circuit, wherein the information provided at the analog input is sampled at a sampling frequency and each sample is stored in one memory cell, wherein the sampling frequency is user-selectable by providing a digital command to the integrated circuit.

14. The integrated circuit of claim 13 further comprising:
    a register coupled to the digital input to hold the information in digital form;
    a converter circuit, coupled between the register and the multiplexer, receiving the information held in the register and generating an analog representation of the information suitable for storage in a memory cell.

15. The integrated circuit of claim 13 wherein the memory cells are analog or multilevel memory cells.

16. An integrated circuit comprising:
    a plurality of memory cells;
    a write circuit coupled to the memory cells; and
    a read circuit to determine a threshold voltage stored in individual memory cells, and to provide an analog equivalent of the stored threshold voltage at an analog output or to provide a digital equivalent of the stored threshold voltage at a digital output, wherein individual memory cells are configurable by the write circuit to store more than two different threshold voltage levels, and the read circuit provides a sequence of analog equivalents to the analog output at a user-selected playback frequency.

17. The integrated circuit of claim 16 wherein the read circuit determines whether a threshold voltage stored in a memory cell is above or below a reference level, and the read circuit provides to the digital output a first logic level when the stored threshold voltage is below the reference level and a second logic level when the stored threshold voltage is above the reference level.

18. The integrated circuit of claim 16 wherein the playback frequency is the sampling frequency used by the write circuit to store the analog signal in the memory cells.

19. The integrated circuit of claim 17 wherein the digital equivalent comprises more than one binary bit.

20. The integrated circuit of claim 14 wherein the converter circuit comprises:
    a bias voltage generator to generate a first and a second bias voltage; and
    a digital data input circuit coupled to the first and second bias voltages and the register, wherein when the information in the register is in a first state, the digital data input circuit outputs the first bias voltage on a first output line and the second bias voltage on a second output line, and when the information in the register is in a second state, the digital data input circuit outputs the second bias voltage on the first output line and the first bias voltage on the second output line.

21. The integrated circuit of claim 20 wherein the bias voltage generator comprises:
    a first and second transistor coupled between a first bias voltage output and a first supply line;
    a third transistor coupled between the first bias voltage output and a second bias voltage output; and
    a third and fourth transistor coupled between the second bias voltage output and a second supply line.

22. The integrated circuit of claim 21 wherein the third transistor has a lower threshold voltage than the third and fourth transistors.

23. The integrated circuit of claim 21 wherein the third transistor is a native device.

24. The integrated circuit of claim 20 wherein the converter circuit further comprises:
    a common mode feedback circuit coupled to the first and second output lines, generating a third bias voltage coupled to a gate of the fourth transistor.

25. An integrated circuit comprising:
    an array of multilevel memory cells;
    a write circuit coupled to store data in the array of multilevel memory cells;
    a digital reference generator, receiving digital data and converting the digital data into an analog equivalent form, wherein the analog equivalent form is provided to the write circuit, and the digital reference generator comprises:
    a bias voltage generator generating a plurality of bias voltages; and
    a digital data input circuit generating the analog equivalent form of the digital data by selecting combinations of the plurality of bias voltages.

26. The integrated circuit of claim 25 wherein the bias voltage generator comprises a plurality of impedances coupled in series, and a node between each of the impedances is coupled to the digital data input circuit.

27. The integrated circuit of claim 25 wherein the digital data input circuit provides a differential voltage output.

28. The integrated circuit of claim 27 wherein the digital reference generator further comprises:
    a common mode feedback circuit coupled to the differential voltage output and coupling back to the bias voltage generator.

29. An integrated circuit comprising a digital reference generator comprising:
    a first impedance coupled between a first supply line and a first output line;
    a second impedance coupled between the first output line and a first node;
    a third impedance coupled between the first node and a second output line;
    a fourth impedance coupled between the second output line and a second supply line;
    a first switch coupled in parallel with the second impedance; and
    a second switch coupled in parallel with the third impedance.

30. The integrated circuit of claim 29 wherein the second and third impedances have different values.

31. A method of storing information in a memory comprising:
    providing an analog signal at an analog signal input;
    providing digital data at a digital signal input;
    sampling the analog signal input at a sampling frequency;
    storing samples of the analog signal in an array of memory cells, wherein a memory cell holds at least one sample of the analog signal; and
    storing the digital data in the array of memory cells, wherein a memory cell holds at least a bit of the digital data, wherein storing the digital data comprises:
    erasing a sector of memory cells;
    writing the digital data in the sector of memory cells; and
    writing a digital value in each memory cell of the sector not written with the digital data.

32. The method of claim 31 wherein a memory cell holds at least two bits of the digital data.

33. The method of claim 31 wherein the digital data is clocked into and stored in the sector of memory cells serially in a first-in, first-out manner.

34. The method of claim 31 further comprising the step of:
    providing a command at the digital signal input to select a user-selected sampling frequency.

35. The method of claim 31 further comprising the step of:
    providing a write circuit to store samples of the analog signal in the memory cells and also store the digital data in the array of memory cells.

* * * * *